(12) United States Patent
Takahashi

(10) Patent No.: US 7,362,639 B2
(45) Date of Patent: Apr. 22, 2008

(54) SEMICONDUCTOR MEMORY DEVICE AND REFRESH CONTROL METHOD

(75) Inventor: Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/273,014

(22) Filed: Nov. 15, 2005

(65) Prior Publication Data

US 2006/0114735 A1   Jun. 1, 2006

(30) Foreign Application Priority Data

Dec. 1, 2004   (JP)   ............................. 2004-348912

(51) Int. Cl.
*G11C 7/00* (2006.01)
(52) U.S. Cl. ...................... 365/222; 365/205
(58) Field of Classification Search ............... 365/222, 365/205
See application file for complete search history.

(56) References Cited

U.S. PATENT DOCUMENTS

| | | | | |
|---|---|---|---|---|
| 6,094,705 | A * | 7/2000 | Song .......................... 711/106 |
| 6,434,076 | B1 * | 8/2002 | Andersen et al. ............ 365/222 |
| 6,721,225 | B2 * | 4/2004 | Tsukude ...................... 365/222 |
| 6,894,917 | B2 * | 5/2005 | Ting et al. ................... 365/149 |
| 2004/0027882 | A1 * | 2/2004 | Nakagawa ................... 365/200 |
| 2004/0160839 | A1 * | 8/2004 | Kim ............................ 365/222 |
| 2006/0044898 | A1 * | 3/2006 | Otsuka ........................ 365/200 |

FOREIGN PATENT DOCUMENTS

| | | |
|---|---|---|
| JP | 59-52495 | 3/1984 |
| JP | 2003-123470 | 4/2003 |

OTHER PUBLICATIONS

NEC Electronics—Product Lineup, Mobile RAM, Nov. 17, 2004.

* cited by examiner

*Primary Examiner*—Michael T Tran
(74) *Attorney, Agent, or Firm*—Young & Thompson

(57) ABSTRACT

Disclosed is a semiconductor-memory device comprising a selector for performing switching control such that in the standby state the refresh operation is performed responsive to an external-refresh-execution command supplied from outside the semiconductor-memory device, while in the active state, the refresh operation is performed, not under the control from outside the semiconductor-memory device, but under the control from a built-in timer.

14 Claims, 5 Drawing Sheets

SEMICONDUCTOR MEMORY DEVICE AND REFRESH CONTROL METHOD

FIELD OF THE INVENTION

This invention relates to a semiconductor-memory device, and more particularly to a semiconductor-memory device that requires refreshing so that data is retained and a refresh control method thereof

BACKGROUND OF THE INVENTION

A dynamic-type semiconductor-memory device (DRAM) comprises a plurality of memory cells, each of which has one transistor and one capacitor, and which occupies a small area. In a DRAM, information is recorded by storing data in the capacitor, so due to leak current, charge stored in the memory cell decreases over time. Therefore, before the stored information is lost, it is necessary to perform a refresh operation in which the information stored in a memory cell is read by a sense amplifier, and then the read data is restored to the memory cell by that sense amplifier. On the other hand, a static-type semiconductor-memory device (SRAM) comprises a plurality of memory cells, each of which is composed by a flip-flop. In a SRAM, a refresh operation is not necessary, however, one memory cell is consisted of four transistors and two load elements, for example, so the area occupied by the memory cell is larger than that of a DRAM, and the chip size of a large capacity SRAM becomes large.

Recently, there has been developed and manufactured such a memory device adapted to high-storage capacity and high-speed application in a portable terminal or the like, that includes dynamic-type memory cells, has input/output interface, for example, compliant with asynchronous-type SRAM specifications (called a pseudo SRAM) and performs hidden refresh operation that does not require refresh control from the outside (see Non-Patent Document 1).

In a typical general-purpose DRAM, refresh control is performed from an external controller, and control is performed such that in an active state, refresh operation is performed under the control from the outside by an interrupt or the like, while in a standby state, the refresh operation is performed periodically under the control from the outside. On the other hand, in the case of a typical pseudo SRAM, in an active state, hidden refresh is used that is triggered by a time out of a built-in timer, for example, and generally refresh control is not performed under the control from the outside, also in a standby state, self refresh is performed. Regardless of whether or not being used for a portable terminal, in a semiconductor-memory device (DRAM), standby control is performed in order to keep power consumption low.

FIG. 5 is a schematic diagram showing an example of a typical conventional DRAM (for example, pseudo SRAM) that has a self-refresh function. Referring to FIG. 5, the DRAM comprises: a memory core 100 including DRAM cells; a row decoder (X decoder) 101 that functions as an address decoder and has a word driver (not shown) that decodes a row address and drives a selected word line; a sense amplifier 102 that senses memory data read on a bit line associated with a selected memory cell (not shown) in the memory core 100, and writes data to a selected memory cell; and a column decoder (Y decoded) 103 that decodes a column address and turns on a selected Y switch (not shown) to connect a bit line to an I/O bus. DRAM cells are arranged in an array format in which at points where each of a plurality of word lines intersects a plurality of bit lines. The DRAM cell comprises a capacitor and a MOS transistor, a gate which is connected to the word line, and one of source and drain of which is connected to the bit line, and the other of source and drain of which is connected to the capacitor. The DRAM further comprises a data-input/output controller 104, address-buffer latches 105A and 105B, multiplexer 106, counter 107, timer 108, refresh-control circuit 109, timing-control circuit 110, read/write-control circuit 111, input buffer 112 and output buffer 113.

The data-input/output controller 104 controls switching between sending write data to be written to the memory core 100 and receiving read data read from the memory core 100. The address-buffer latch 105A receives and latches a row address ROWAdd from an address terminal Add. The address-buffer latch 105B receives and latches a column address COLAdd from an address terminal Add. The latch timing of the address-buffer latches 105A and 105B can be when an address-valid signal not shown (signal that indicates that the address signal on an address bus is valid) is activated. The row address ROWAdd output from the address-buffer latch 105A is supplied to one of the input terminals of the multiplexer 106, and the refresh address REFAdd from the counter 107 is supplied to the other input terminal during refresh. The multiplexer 106 receives a refresh-control signal φ REF from the refresh-control circuit 109 as a selection-control signal, and during refresh, selects the refresh address REFAdd and supplies it to the row decoder 101, and at all other times, selects the row address ROWAdd from the address-buffer latch 105A and supplies it to the row decoder 101.

In a standby state, the refresh-control circuit 109 performs control such that the counter 107 counts up responsive to a trigger signal (REFREQ; trigger signal for requesting a refresh) that is generated each time when timeout occurs in a timer 108, and the output from the counter 107 is supplied to the multiplexer 106 as the refresh address REFAdd. In an active state, the refresh-control circuit 109 carries out hidden refresh that does not require refresh control from the outside. In hidden refresh, when the refresh operation invoked by the timeout in the timer 108 occurs at the same time as read/write access for example, the refresh-control circuit 109 performs control causing read/write access to wait until the refresh operation has been completed, or any other control methods for performing refreshing automatically may be used. One of other method is such that when a predetermined time has elapsed after read/write access, refreshing is carried out automatically. The read/write-control circuit 111 receives a write-enable signal /WE, and chip-select signal /CS and performs read/write control. The timing-control circuit 110 receives the refresh-control signal φ REF from the refresh-control circuit 109, and a read/write-control signal R/W for and controlling read/write operation output from the read/write-control circuit 111 and supplies to the row decoder 101 a strobe signal φ RS for stipulating an activation period of a selected word line driven by a word driver (not shown) provided in the row decoder 101. The write data from a data terminal Data is supplied to the data-input/output controller 104 via the input buffer 112, and is written in the selected cell of the memory core 100. Read data that has been read from the selected cell is output from the data-input/output controller 104 to the data terminal Data via the output buffer 113. The output buffer 113 is activated when the output-enable signal /OE is at a low level, while when the output-enable signal /OE is at a high level, the output of the output buffer 113 is set in a high-impedance state. In FIG. 5, '/' provided in front of a signal name (terminal name) such as /CS, /WE and /OE indicates that the active state thereof is when the level of the signal is at a low level (low active). Construction is also possible in which there is a standby-control circuit (not shown) that receives the chip-select signal /CS and performs standby control of the memory core 100.

FIG. 6 is a diagram illustrating an example of operation when the semiconductor-memory device shown in FIG. 5 changes from the standby state to the active state. As the read/write command, the chip-select signal /CS and the write-enable signal /WE may be used in such a way wherein a read operation may be performed when the chip-select signal /CS is low, and the write-enable signal /WE is high, while a write operation may be performed when the chip-select signal /CS is low, and the write-enable signal /WE is low. The other configuration may be such that a command is supplied to a command decoder (not shown) and based on the decoded result from that command decoder, a signal is generated that control read/write access.

As shown in FIG. 6, in the conventional semiconductor-memory device shown in FIG. 5, if, at the time of the transition from the standby state to the active state, which is invoked by an access request, the refresh operation that was started in the standby state continues to be performed, it is necessary to perform control so that the read/write access is delayed until that refresh operation ends.

In the Patent Document 1, the configuration of a DRAM that is as easy to use as an SRAM is disclosed in which the DRAM comprises an auto-refresh circuit that detects the timing of change in an address signal, and generates all timing required for the write, read and refresh operations, simplifies timing control from the outside, and performs self refresh and auto refresh of dynamic-type memory cells according to address signal that are formed internally according to an external refresh signal.

Also, as a pseudo SRAM, in the Patent Document 2, there is disclosed a DRAM having an interface that is SRAM compatible and that performs hidden refresh that is capable of completely hiding refresh operation from the outside.

[Patent Document 1]
Japanese Patent Kokai Publication No. JP-A-59-52495 (FIG. 1)

[Patent Document 2]
Japanese Patent Kokai Publication No. JP-P2003-123470A (FIG. 1)

[Non-patent Document 1]
NEC Electronics—Product Lineup, Mobile RAM, Nov. 17, 2004 Internet search <URL: http://www.necel.com/memory/Japanese/products/msram/info.html/>

SUMMARY OF THE DISCLOSURE

As was described with reference to FIG. 5 and FIG. 6, in the conventional semiconductor-memory device, if, at the time of changing from the standby state to the active state, a refresh operation started during the standby state is being performed, it is necessary to delay read/write operation until that refresh operation ends, which invites delay in read/write access time.

In the conventional semiconductor-memory device described referring to FIG. 5 and FIG. 6, in the standby mode particularly, self refresh is performed entirely based on a timeout of the timer 8 provided in the semiconductor-memory device, and read/write access supplied from the outside is performed asynchronously, so to speak, so it is difficult to adequately control the occurrence of the aforementioned delay.

As a result, test time of the semiconductor-memory device by an test equipment, and especially test time of a digit (bit)-disturb-hold test that verifies whether there is data hold time, increases, and hence the ratio of the cost for device testing to the total chip cost increases. The reason for that is as follows. In the digit-disturb-hold test, data is written to all of the memory cells in which the gates of the MOS transistors (cell transistors) are connected to the word lines other than the specified word line for which disturbance is performed, and while the target cell holds data, by setting the number of times the word lines are to be alternated between selection level and non-selection level, the effect on the memory data held in the target cell is checked. For example, when the data hold characteristic of a memory cell is 16 ms and the access time (clock cycle) is 100 ns, in order to satisfy such a standard that assumes a data hold time of 16 ms, the number of accesses becomes 1.6 million times. In the case of a memory cell whose data-hold characteristic is not good, charge stored in a cell capacitor leaks through the MOS transistor. This digit-disturb-hold test requires a failure long test time. Particularly, in the case of a semiconductor-memory device that performs refresh during a standby state, and performs hidden refresh in an active state, the refresh operation is performed by control inside the semiconductor-memory device, which is independent of control by a memory tester, and when the aforementioned delay occurs, the test time of the digit-disturb-hold test becomes further longer.

A semiconductor-memory device according to one aspect of the invention comprises: a memory array containing a plurality of memory cells requiring refresh operation in order to maintain the data; and a circuit that, in the standby state, receives refresh control that is supplied from outside the semiconductor-memory device and performs refresh, and in the active state, performs refresh according to control from inside the semiconductor-memory device and not according to control from outside the semiconductor-memory device.

Preferably, in the present invention, the refresh period in the active state can be such that it is shorter than the refresh period according to control from the outside in the standby state.

Preferably, in the present invention, the active period of the selected word line corresponding to the refresh address in the active state can be such that it is shorter than the active period of the selected word line corresponding to the refresh address in the standby state.

Preferably, in the present invention, the refresh address in the standby state can be such that it is continuous with the refresh address in the active state.

A semiconductor-memory device according to another aspect of the present invention, comprises: a memory array containing a plurality of memory cells, each requiring refreshing so that data is retained; and a control circuit for performing control to select, as refreshing in a standby state, one between refreshing under the control from inside said semiconductor-memory device and refreshing under the control from outside said semiconductor-memory device and to carry out refreshing in the standby state under the selected control, said control circuit further performing control so as to carry out refreshing in an active state under the control from inside said semiconductor-memory device.

Preferably, in the present invention, the semiconductor-memory device further comprises a timer for generating a trigger signal for periodically issuing a refresh request, wherein the control circuit selects as the refreshing in the standby state, one between refreshing under the control from inside said semiconductor-memory device and refreshing under the control from outside said semiconductor-memory device, based on the period of said timer and the period of an external refresh-execution command signal supplied from outside said semiconductor-memory device.

A method according another aspect of the present invention is a refresh-control method of a semiconductor-memory device having a memory array containing a plurality of memory cells that requires refreshing so that data is retained, said method comprising the steps of:

performing control so that, in a standby state, refreshing is performed responsive to a refresh control signal supplied from outside said semiconductor-memory device; and performing control so that in an active state, refreshing is performed under the control from inside said semiconductor-memory device and not under the control from outside said semiconductor-memory device.

The meritorious effects of the present invention are summarized as follows.

With the present invention, in the active state, it is possible to set the timer period that regulates the refresh period to a short period, and together with being able to reduce the test time, it is possible to improve the data-hold characteristics of the memory cells. With this invention, restrictions of the disturb conditions in the active state that are critical to the standards for the refresh period (data hold time) are done away with.

Furthermore, with the present invention, since refresh is not performed when changing from the standby state to the active state, delays in read/write access do not occur when changing to the active state, making it possible to increase the speed of the access time.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

A preferred embodiment of the invention will be described below with reference to accompanying drawings. With a semiconductor-memory device according to the present invention, a refresh-execution command is supplied to the semiconductor-memory device from the outside by a CPU, controller and the like, in a standby state. The semiconductor-memory device receives the refresh-execution command and performs the refresh operation. In an active state, the semiconductor-memory device performs hidden refresh that hides the refresh operation from the outside. Any method can be used for performing hidden refresh.

Figure 1:
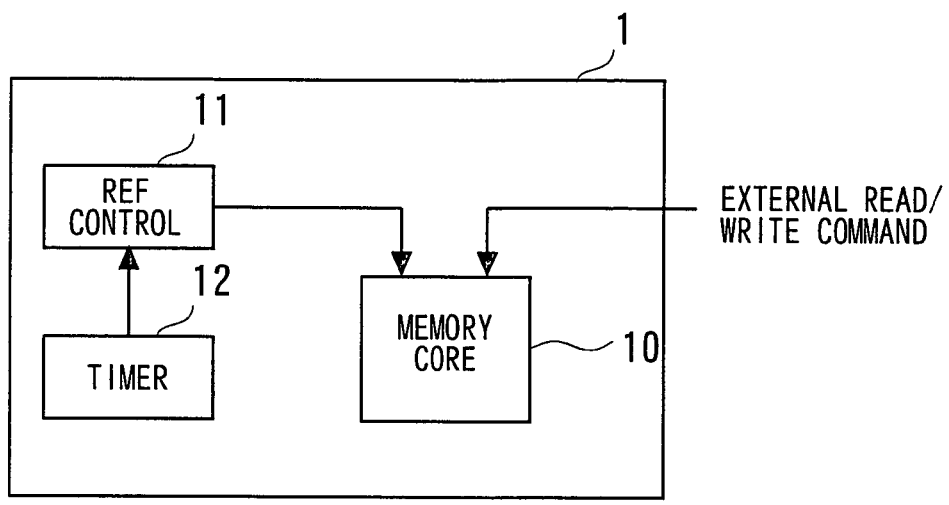
FIG. 1 is a diagram for explaining an embodiment of the invention.

FIG. 1 is a diagram showing the configuration of an embodiment of the present invention. In FIG. 1, the configuration of a semiconductor-memory device in an active state is schematically illustrated. Referring to FIG. 1, when a semiconductor-memory device 1 is in the active state, an external read/write command supplied to the semiconductor-memory device 1 from outside the semiconductor-memory device such as from a controller (not shown) is delivered to a memory core 10. Also, in the active state, refresh control is not performed from the outside, rather self refresh (or hidden refresh) is performed inside the semiconductor-memory device 1. For example, when a timeout occurs in a timer 12, a trigger signal generated by the timeout acts as a refresh-request signal. The refresh control circuit 11 for generating a refresh-address, responsive to the trigger signal, generates a refresh address and performs control to carry out refreshing of the memory core 10. In the active state, when the self-refresh operation occurs at the same time as an external read/write command, control is performed, for example, so as to cause read/write access to wait until the self-refresh operation ends. Or, control is performed such that, in the active state, self refresh is always inserted after or before read/write access.

Figure 2:
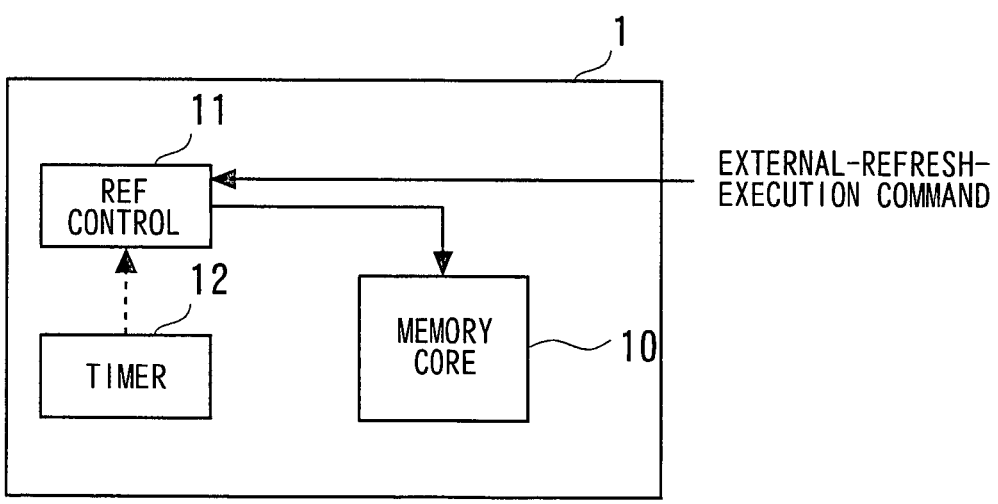
FIG. 2 is a diagram for explaining an embodiment of the invention.

On the other hand, in the standby state, the timer 12 is not used and refresh is performed after receiving a refresh-execution command from the outside. FIG. 2 is a diagram illustrating the configuration of an embodiment of the invention in the standby state. As shown in FIG. 2, in the standby state, the timer 12 is not used (it is in the inactive state or unselected state), and refreshing is performed only when an external-refresh-execution command is received by the semiconductor-memory device 1. In other words, in the standby state, an external-refresh-execution command, which is supplied to the semiconductor-memory device 1 from outside the semiconductor-memory device from a controller or the like (not shown), is delivered to the refresh-control circuit 11. The refresh control circuit 11, responsive to the external-refresh-execution command, generates a refresh address and performs refreshing of the memory core 10.

Preferably, in the present embodiment of the invention, the hidden-refresh period be shorter than the specified value of the refresh period from the outside. This compensates for the data-hold characteristic during the active state.

In the present embodiment, the refresh-address counter gives continuity to the two type of refresh operations. In other words, when hidden refresh is performed after refresh is performed according to an external-refresh-execution command in the standby state, the counter for generating the refresh address, generates the next refresh address after the last refresh address in the standby state.

Preferably, in the present embodiment, as to the pulse width of a selected word line that corresponds to the refresh address during the refresh operation, the pulse width of a selected word line in the hidden refresh in the active state is set shorter than that in the refresh executed by the external-refresh-execution command in the standby state. This makes high-speed access in the active state possible.

Referring to FIG. 2, another embodiment of the present invention will now be described. In this embodiment, the refresh control circuit 11 is adapted to select, as refreshing in the standby state, one between refreshing under the control from inside the semiconductor-memory device 1 and refreshing under the external control and to carry out refreshing in the standby state under the selected control. By the way, the refreshing under the control from inside the semiconductor-memory means that refreshing is carried out responsive to the trigger signal output from the timer 12, while refreshing under the control from outside the semiconductor-memory means that refreshing is executed responsive to the external-refresh execution command supplied from outside the semiconductor-memory 1.

Preferably, in the present embodiment, the refresh control circuit 11 selects as the refreshing in the standby state, one between refreshing under the control from inside the semiconductor-memory device 1 and refreshing under the control from outside the semiconductor-memory device 1, based on the period of the timer 12 and the period of the external refresh-execution command signal supplied from outside the semiconductor-memory device 1. More specifically, if, as to data retention capability of the memory cell, the refresh period specified by the timer 12 is more suited than the refresh period specified by the external refresh-execution command signal, the timer 12 is used or activated. In this case, the refresh control circuit 11 generates a refresh-address, responsive to the trigger signal periodically output from the timer 12, and performs control to carry out refreshing of the memory core 10. If, as to data retention capability of the memory cell, the refresh period specified by the timer 12 is less suited than the refresh period specified by the external refresh-execution command signal, the timer 12 is not used or inactivated and the refresh control circuit 11, on receipt of the external refresh-execution command, carries out refreshing of the memory core 10.

In the active state, the refresh control circuit 11 carries out refreshing of the memory core 10, responsive to the trigger signal output from the timer 12, in the same manner as the embodiment described with reference to FIG. 1.

Figure 3:
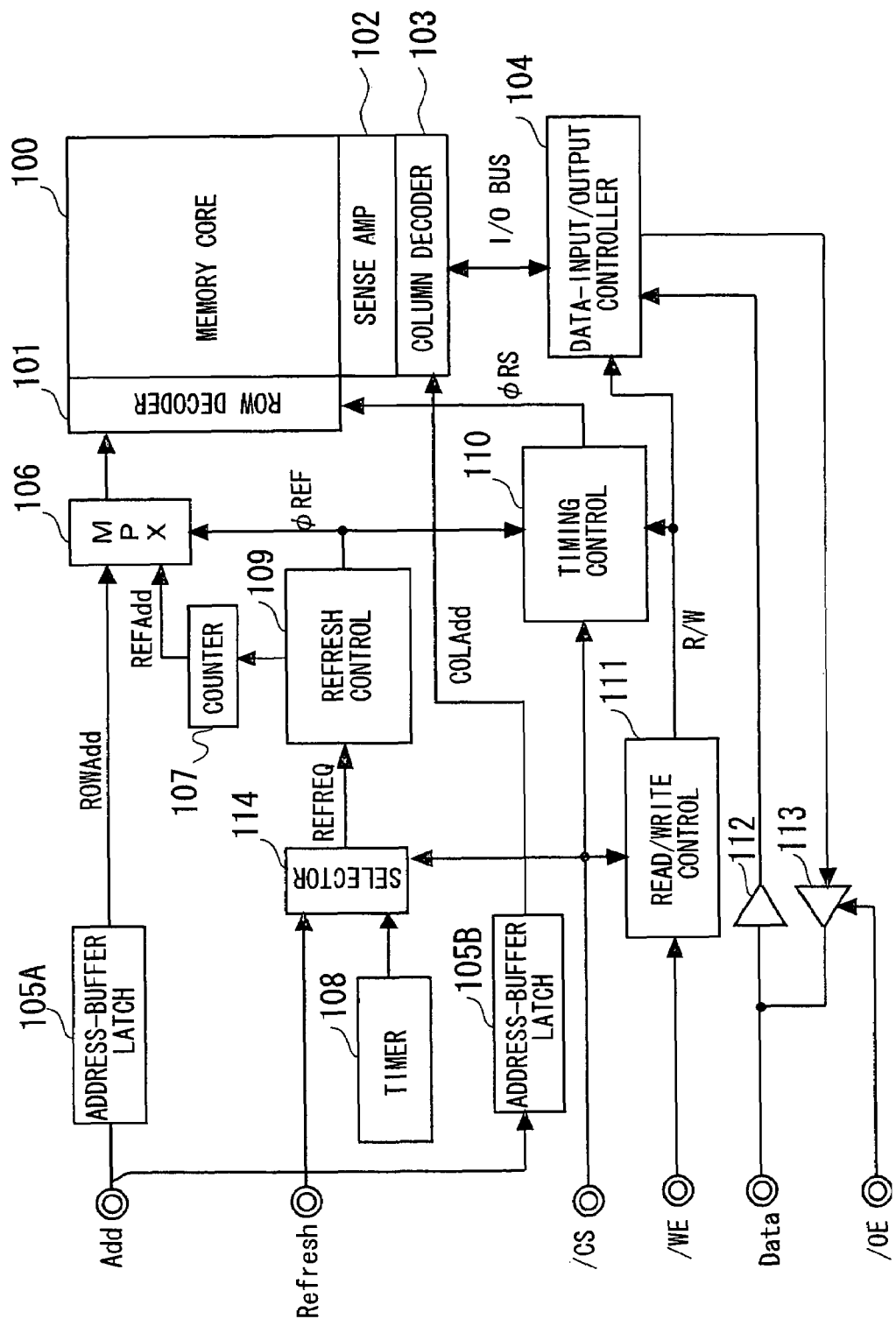
FIG. 3 is a diagram showing the configuration of an embodiment of the invention.
Figure 5:
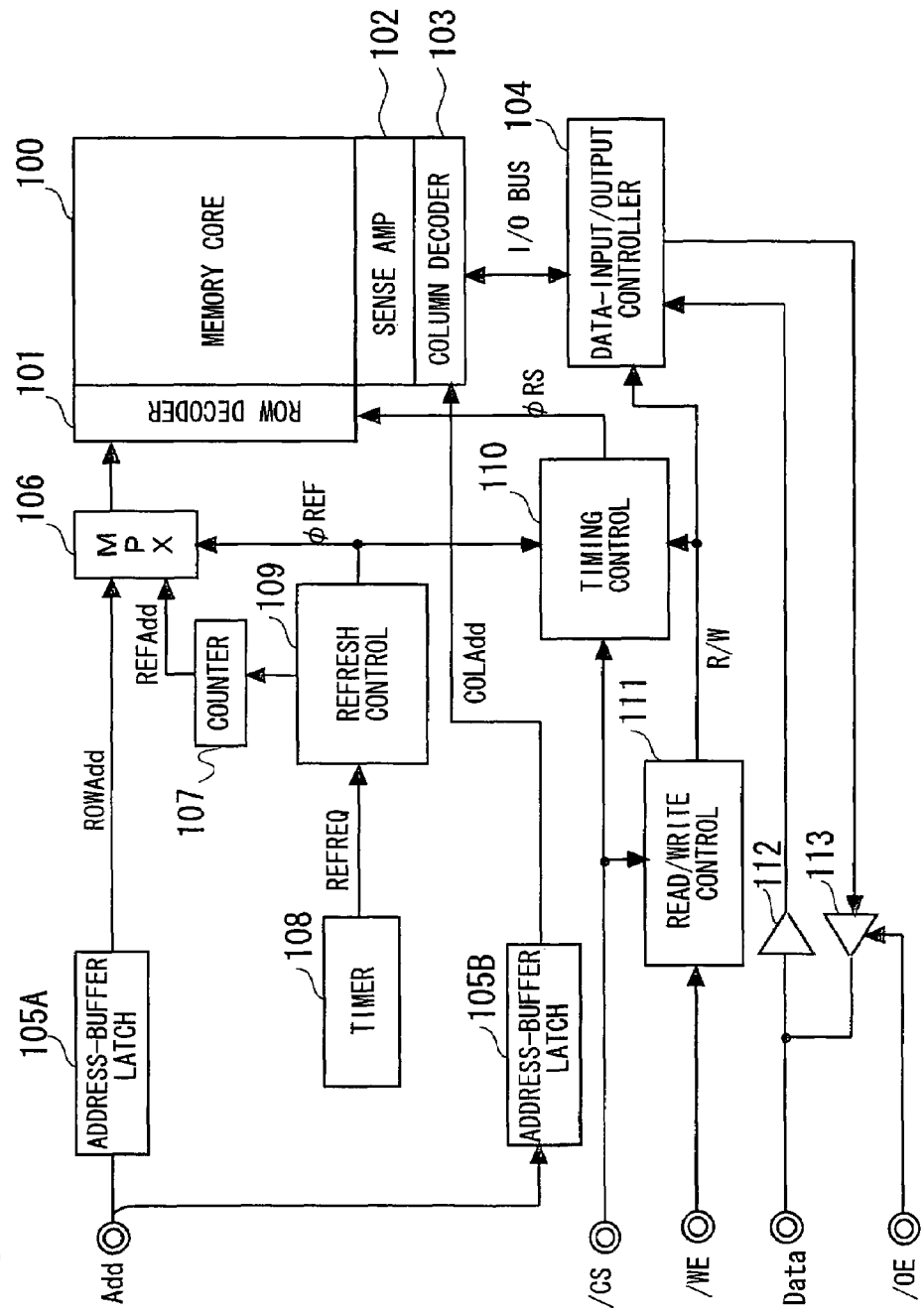
FIG. 5 is a diagram showing the configuration of a conventional semiconductor-memory device.
Figure 6:
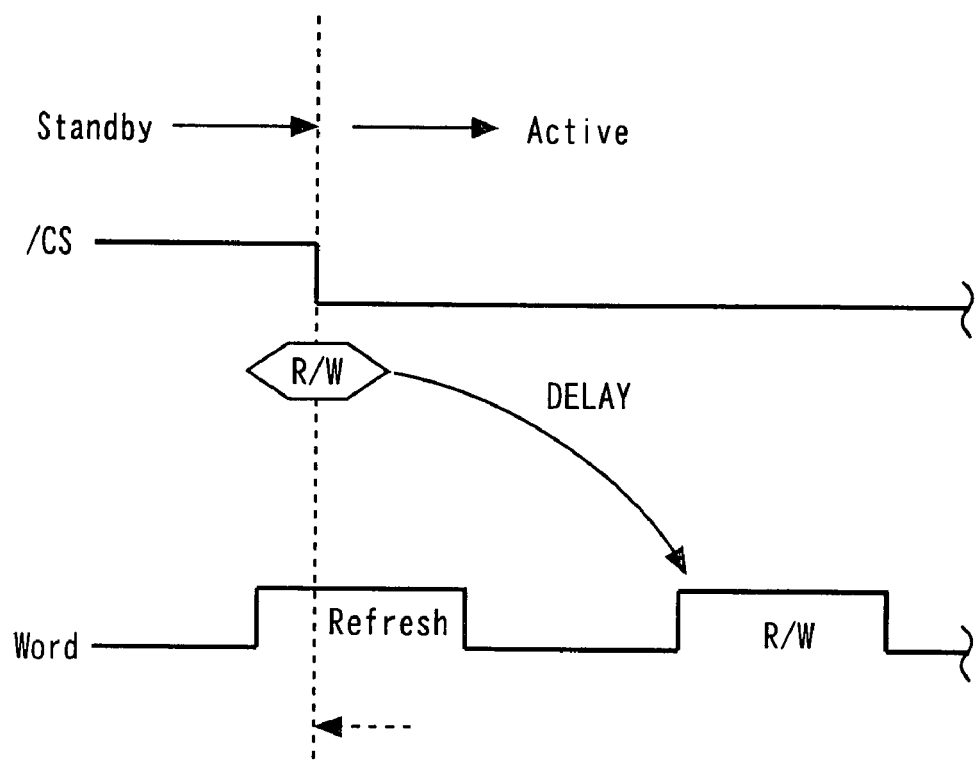
FIG. 6 is a diagram for explaining the operation of a conventional semiconductor-memory device.

FIG. 3 schematically shows an example of the configuration of the semiconductor-memory device according to the embodiment of the present invention. In FIG. 3, the same reference numerals are used for elements that are equivalent to or are the same as those in FIG. 5. The semiconductor-memory device according to the present embodiment differs from the configuration shown in FIG. 5 in that it comprises an external-refresh terminal and a selector 114. More specifically, referring to FIG. 3, the semiconductor-memory device according to the present embodiment comprises: a memory core 100 including DRAM cells arranged in an array format at each of the points where a plurality of word lines (not shown) and a plurality of bit lines (not shown) intersect; a row decoder 101 that decodes a row address and has a word driver (not shown) for driving a selected word line; a sense amplifier 102 that senses memory-cell data read from a selected memory cell on an associated bit line, and writes data to a selected memory cell; and a column decoder 103 that decodes a column address, turns ON a selected Y switch (not shown) and connects the bit lines to the I/O bus. Furthermore, the semiconductor-memory device according to the present embodiment comprises: a data-input/output controller 104, address-buffer latches 105A, and 105B, multiplexer 106, counter 107, timer 108, refresh-control circuit 109, timing-control circuit 110, read/write-control circuit 111, input buffer 112, output buffer 113 and selector 114.

The data-input/output controller 104 controls switching between sending data to be written to and receiving read data from the memory core 100. The address-buffer latch 105A receives and latches a row address ROWAdd from the address terminal Add. The address-buffer latch 105B receives and latches a column address COLAdd from the address terminal Add. The latch timing of the address-buffer latches 105A and 105B can be when an address-valid signal (not shown) is asserted. The address-valid signal is a signal for indicating that the address signal on the address bus is valid. The row address ROWAdd output from the address-buffer latch 105A is supplied to one of the input ends of the multiplexer 106, and the refresh address REFAdd output from the counter 107 during refresh is supplied to the other input end of the multiplexer 106.

In the present embodiment, the selector 114, which receives the external-refresh-execution command signal from an external-refresh (Refresh) terminal, and the trigger signal output from the timer 108 when a timeout occurs in the timer 108, selects the external-refresh-execution command signal in the standby state to supply the external-refresh-execution command signal to the refresh-control circuit 109 as a refresh-request signal REFREQ, while in the active state, the selector 114, selects the trigger signal output from the timer 108 when a timeout occurs in the timer 108, to supply the trigger signal to the refresh-control circuit 109 as a refresh-request signal REFREQ.

The refresh-control circuit 109, responsive to the refresh-request signal REFREQ output from the selector 114, performs control to count up the counter 107 and outputs a refresh-control signal φ REF.

The output from the counter 107 is fed to the multiplexer 106 as a refresh address REFAdd. The multiplexer 106, which receives the refresh-control signal φ REF from the refresh-control circuit 109 as a selection-control signal, during refresh, selects the refresh address REFAdd to supply REFAdd to the row decoder 101, while at all other times, the multiplexer 106 supplies the row address ROWAdd from the address-buffer latch 105A to the row decoder 101.

In the active state, the refresh-control circuit 109 performs hidden refresh that does not require refresh control from the outside. In hidden refresh, when the refresh operation triggered by the timer 108, and read/write access occur at the same time, for example, control is performed so as to have read/write access wait until the refresh operation has ended. It is needless to say to use any other control. For example, control so as to perform refresh automatically after a specified amount of time has elapsed after read/write access or any other control may be used. When performing control to have read/write access wait until the refresh operation ends, construction can be such that there is provided a WAIT terminal for notifying a controller (not shown) or the like to have read/write access wait.

The read/write-control circuit 111, which receives a write-enable signal /WE and chip-select signal /CS, is adapted to perform read/write control.

The timing-control circuit 110, which receives the refresh-control-signal φ REF from the refresh-control circuit 109 and the read/write-control signal R/W for controlling read/write operation, output from the read/write-control circuit 111, generates and supplies a strobe signal φ RS or the like for regulating the activation period of the selected word line driven by the word driver (not shown) provided in the row decoder 101. In the present embodiment, the timing-control circuit 111 is controlled so that the active period of the selected word line during refresh in the active state (in other words, when the level of the chip-select signal is at a low) level is shorter than the active period of the selected word line during refresh that is carried responsive to an external-refresh-execution command in the standby state. This control is realized by the timing-control circuit 110 performing switching control of the pulse width of the strobe signal φ RS that regulates the active period of the word line between short and long periods according to whether the level of the chip-select signal /CS is at a low level or at a high level, when the refresh-control signal φ REF is in the active state.

The write data from the data terminal Data is fed to the data-input/output controller 104 via the input buffer 112 and written in a selected cell in the memory core 100. Also, data read from a selected cell in the memory core 100 is output from the data-input/output controller 104 to the data terminal via the output buffer 113. The output buffer 113 is activated when the output-enable signal /OE is low, while the output of the output buffer 113 is in a high-impedance state when the output-enable signal /OE is at a high level. In FIG. 3, construction is also possible in which there is provided a standby-control circuit (not shown) that receives the chip-select signal /CS and performs standby control of the memory core 100.

In the present embodiment, the hidden-refresh period (timeout period of the timer 108) is set to a period that is shorter than the refresh period from the outside in the standby state.

In the present embodiment, the selector 114 performs switching control of the signal for controlling the count-up operation of the counter 107 in the standby state and active state, as a result of which continuity of the count output of the counter 107 is maintained for the refresh operation in both the standby state and active state. For example, if there is a transition to an active state after the refresh operation according to an external-refresh-execution command in the standby state ends, and hidden refresh is performed, the counter 107 generates a refresh address after the last refresh address in the standby mode.

Figure 4:
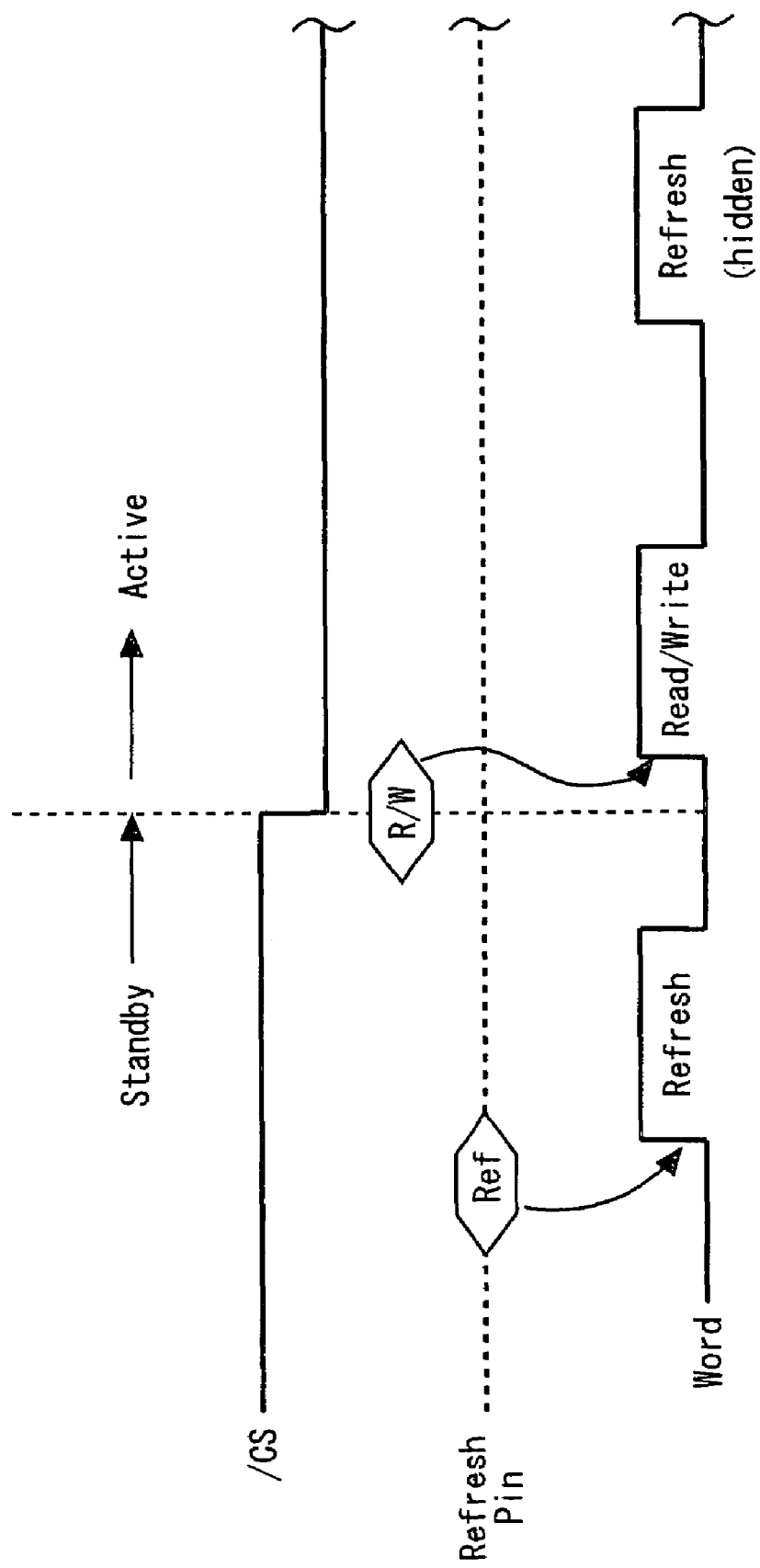
FIG. 4 is a diagram for explaining the operation of an embodiment of the invention.

FIG. 4 is a diagram illustrating the operation of the embodiment of the present invention. During standby (when the chip-select signal /CS is at a high level), the refresh operation is performed when an external-refresh-execution command (REF) is supplied from the controller (not shown) to the Refresh terminal of the semiconductor-memory device. First, when a read/write-access request is issued to the semiconductor-memory device, the active state is set with the chip-select signal /CS being low. At this time, the controller (not shown) recognizes that a read/write-access request has been issued and hence the controller does not supply an external-refresh-execution command to the Refresh terminal of the semiconductor-memory device. Also, in the standby state, when the controller (not shown) has supplied a refresh-execution command (REF) to the semiconductor-memory device, a read/write-access request is issued after the refresh operation corresponding to the external-refresh-execution command has ended. In other words, with the present embodiment, the refresh operation in the standby state is performed under the control of the controller (not shown), as a result of which a collision between a transition from the standby state to the active state and the refresh operation started during the standby state does not occur.

With the present embodiment, when testing the semiconductor-memory device with a memory tester or the like, an occurrence of such a case wherein a refresh operation is being performed when changing from the standby state to the active state, so the condition of delaying read/write access, is reliably and effectively avoided. With the present embodiment, when changing from the standby state to the active state, it is possible to immediately perform the read/write operation in accordance to a read/write command, thereby contributing to shorten test time of the semiconductor memory device. It is also possible to perform the refresh operation according to a timeout from the timer 108 after a specified amount of time has elapsed after the read/write operation, for example.

In the present embodiment, configuration may be such that in the standby state, the refresh terminal (Refresh) for receiving the external-refresh-execution command can be shared by another terminal, for example, the refresh terminal (Refresh) may be shared with the terminal for receiving the write-enable signal /WE or output-enable signal /OE. This is because the external-refresh-execution command is received during the standby state, and is not received during the active state, and the write-enable signal /WE is received only in the active state and is not used during the standby state. By adopting the above described configuration, an increase in the number of control pins is suppressed.

With the present embodiment, an example of a pseudo SRAM in which the input/output interface is compatible with an SRAM is described, however, the present invention is not limited to a pseudo SRAM, and can also be applied to any arbitrary DRAM. In other words, the present invention can be similarly applied to such a DRAM or the like in which the row addresses and column addresses are multiplexed, for example. Also, the invention can be applied to a pseudo SRAM in which the interface is compatible with a synchronous SRAM.

The present invention was explained using the embodiment above, however, the invention is not limited to just the configuration of the embodiment described above, and of course various changes and corrections that could be obtained by someone skilled in the art are also within the scope of this invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor-memory device comprising:
   a memory array containing a plurality of memory cells, each requiring refreshing so that data is retained; and
   a circuit for performing switching control such that, wherein,
   i) in a standby state, refreshing is carried out responsive to a refresh control command supplied from outside said semiconductor-memory device with refresh timing in the standby state controlled by the external refresh control command without internally generating the refresh timing and without using an internal timer for refresh timing in the standby state, while,
   ii) in an active state, refreshing is carried out under the control from inside said semiconductor memory device.

2. The semiconductor memory device according to claim 1, wherein said circuit for performing switching control includes a selector receiving said refresh control signal supplied from the outside and a trigger signal periodically generated by a refresh timer provided in said semiconductor-memory device; said selector, receiving a chip select signal and selecting said refresh control signal from the outside when said chip select signal indicates the standby state, while selecting said trigger signal when the said chip select signal indicates active state, for outputting the so selected signal as a refresh request.

3. The semiconductor-memory device according to claim 1, further comprising a circuit for performing control such that refresh period in the active state is shorter than the refresh period under the control from outside said semiconductor memory device in the standby state.

4. The semiconductor-memory device according to claim 1, further comprising a circuit for performing control such that a period of a selected word line corresponding to a refresh address being activated in the active state is shorter than a period of a selected word line corresponding to a refresh address being activated in the standby state.

5. The semiconductor-memory device according to claim 1, wherein the refresh address in the standby state is made continuous with the refresh address in the active state.

6. The semiconductor-memory device according to claim 1, further comprising: a timer for generating a trigger signal for periodically issuing a refresh request; a terminal for receiving a refresh-execution-command signal supplied from outside said semiconductor-memory device; a refresh control circuit for receiving a refresh-request signal, generating a refresh address to perform control of refreshing; and a selector for performing switching control so that, when a control signal, supplied from outside the semiconductor-memory device controlling the standby state and active state indicates the standby state, said refresh-execution-command signal from said terminal is supplied to said refresh-control circuit as said refresh-request signal, and when said control signal indicates the active state, the trigger signal from said timer is supplied to said refresh-control circuit as said refresh-request signal.

7. The semiconductor-memory device according to claim 1, wherein the semiconductor-memory device is adapted to perform hidden refresh in the active state, with input/output interface thereof being compliant with SRAM specifications.

8. A semiconductor-memory device comprising:
a memory array containing a plurality of memory cells, each requiring refreshing so that data is retained; and
a control circuit for performing control to select, as refreshing in a standby state, one between refreshing under the control from inside said semiconductor-memory device and refreshing under the control from outside said semiconductor-memory device and to carry out refreshing in the standby state under the selected control,
said control circuit further performing control so as to carry out refreshing in an active state under the control from inside said semiconductor-memory device, and
said control circuit performing control so as to carry out refresh timing in the standby state under control by an outside refresh control command without internally generating the refresh timing and without using an internal timer for refresh timing in the standby state.

9. The semiconductor-memory device according to claim 8, further comprising a timer for generating a trigger signal for periodically issuing a refresh request; wherein said control circuit selects as the refreshing in the standby state, one between refreshing under the control from inside said semiconductor-memory device and refreshing under the control from outside said semiconductor-memory device, based on the period of said timer and the period of an external refresh-execution command signal supplied from outside said semiconductor-memory device.

10. A method of controlling refreshing in a semiconductor-memory device having a memory array containing a plurality of memory cells requiring refreshing so that data is retained, said method comprising:
performing control so that in a standby state refreshing is carried out responsive to a refresh control signal supplied from outside said semiconductor-memory device with refresh timing in the standby state controlled by the outside refresh control signal without internally generating the refresh timing and without using an internal timer for refresh timing in the standby state; and
performing control so that, in an active state, refreshing is carried out, not under the control from outside said semiconductor-memory device, but under the control from inside said semiconductor-memory device.

11. The method according to claim 10, further comprising setting the refresh period in the active state shorter than the refresh period under control from the outside in the standby state.

12. The method according to claim 10, further comprising setting a period of a selected word line corresponding to the refresh address being activated in the active state, shorter than a period of a selected word line corresponding to a refresh address being activated in the standby state.

13. The method according to claim 10, wherein the refresh address in the standby mode is continuous with the refresh address in the active mode.

14. A method of controlling refreshing in a semiconductor-memory device having a memory array containing a plurality of memory cells requiring refreshing so that data is retained, said method comprising:
performing a first refresh at a first interval in response to a first refresh request generated by the internal timer in an active mode; and
performing a second refresh inputted from outside and without using the internal timer control so that, in an active state, refreshing is carried out under the control from inside said semiconductor-memory device.

* * * * *